United States Patent
Chen et al.

(10) Patent No.: US 9,341,166 B2
(45) Date of Patent: *May 17, 2016

(54) ELECTROSTRICTIVE COMPOSITE AND ELECTROSTRICTIVE ELEMENT USING THE SAME

(71) Applicants: Tsinghua University, Beijing (CN); HON HAI PRECISION INDUSTRY CO., LTD., New Taipei (TW)

(72) Inventors: Lu-Zhuo Chen, Beijing (CN); Chang-Hong Liu, Beijing (CN); Jia-Ping Wang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 181 days.

This patent is subject to a terminal disclaimer.

(21) Appl. No.: 13/972,895

(22) Filed: Aug. 21, 2013

(65) Prior Publication Data

US 2013/0333374 A1    Dec. 19, 2013

Related U.S. Application Data

(63) Continuation of application No. 12/795,867, filed on Jun. 8, 2010, now Pat. No. 8,536,767.

(30) Foreign Application Priority Data

Oct. 22, 2009    (CN) .......................... 2009 1 0110312

(51) Int. Cl.
| | |
|---|---|
| *H01L 41/08* | (2006.01) |
| *F03G 7/06* | (2006.01) |
| *F03G 7/00* | (2006.01) |
| *B32B 3/26* | (2006.01) |

(Continued)

(52) U.S. Cl.
CPC . *F03G 7/065* (2013.01); *B32B 3/26* (2013.01); *B32B 5/02* (2013.01); *B32B 27/04* (2013.01); *F03G 7/005* (2013.01); *Y10T 428/24994* (2015.04); *Y10T 428/249921* (2015.04); *Y10T 428/249945* (2015.04); *Y10T 428/249978* (2015.04)

(58) Field of Classification Search
CPC .................................. H01B 1/04; H01L 41/08
USPC .................. 252/500–511; 310/311, 365, 800; 977/734, 742, 788, 932
See application file for complete search history.

(56) References Cited

U.S. PATENT DOCUMENTS

| | | | | |
|---|---|---|---|---|
| 6,555,945 | B1 * | 4/2003 | Baughman et al. | 310/300 |
| 8,076,829 | B2 * | 12/2011 | Chen et al. | 310/363 |

(Continued)

OTHER PUBLICATIONS

Chen AIP ("Electrothermal actuation based on carbon nanotube network in silicone elastomer." AIP, 92, 263104-1 to 3, online Jul. 1, 2008).*

*Primary Examiner* — Tri V Nguyen
(74) *Attorney, Agent, or Firm* — Novak Druce Connolly Bove + Quigg LLP

(57) ABSTRACT

An electrostrictive composite includes a flexible polymer matrix and a carbon nanotube film structure. The carbon nanotube film structure is at least partially embedded into the flexible polymer matrix through a first surface. The carbon nanotube film structure includes a plurality of carbon nanotubes combined by van der Waals attractive force therebetween.

16 Claims, 10 Drawing Sheets

(51) Int. Cl.
*B32B 5/02* (2006.01)
*B32B 27/04* (2006.01)

(56) References Cited

U.S. PATENT DOCUMENTS

| | | | |
|---|---|---|---|
| 8,354,772 B1 * | 1/2013 | Chen et al. | 310/311 |
| 8,450,903 B2 * | 5/2013 | Chen et al. | 310/311 |
| 2005/0040371 A1 * | 2/2005 | Watanabe et al. | 252/500 |
| 2005/0168113 A1 * | 8/2005 | Hirai et al. | 310/800 |
| 2006/0057361 A1 * | 3/2006 | Ounaies et al. | 428/323 |
| 2006/0084752 A1 * | 4/2006 | Ounaies et al. | 524/496 |
| 2007/0295714 A1 * | 12/2007 | Liu et al. | 219/553 |
| 2008/0236804 A1 * | 10/2008 | Cola et al. | 165/185 |
| 2008/0280137 A1 * | 11/2008 | Ajayan et al. | 428/375 |
| 2008/0292840 A1 * | 11/2008 | Majumdar et al. | 428/114 |
| 2009/0116171 A1 * | 5/2009 | Liu et al. | 361/503 |
| 2010/0213790 A1 * | 8/2010 | Chen et al. | 310/307 |
| 2010/0288981 A1 * | 11/2010 | Marcolongo et al. | 252/511 |
| 2012/0235097 A1 * | 9/2012 | Dhinojwala et al. | 252/511 |

* cited by examiner

ELECTROSTRICTIVE COMPOSITE AND ELECTROSTRICTIVE ELEMENT USING THE SAME

RELATED APPLICATIONS

This application is a continuation application of U.S. patent application Ser. No. 12/795,867, filed Jun. 8, 2010, entitled, "ELECTROSTRICTIVE COMPOSITE AND ELECTROSTRICTIVE ELEMENT USING THE SAME," which claims all benefits accruing under 35 U.S.C. §119 from China Patent Application No. 200910110312.7, filed on Oct. 22, 2009 in the China Intellectual Property Office, hereby incorporated by reference.

BACKGROUND

1. Technical Field

The present disclosure relates to electrostrictive composites, and particularly, to a carbon nanotube based electrostrictive composite and an actuator using the same.

2. Description of Related Art

An actuator is a device that converts input energy to mechanical output energy. For example, actuators can be classified into electrostatic, electromagnetic, and electrothermic type actuators.

A typical electrothermic type actuator has a double-layer structure and includes two metallic layers having different thermal expansion coefficients. When a current is applied, the electrothermic type actuator bends because the thermal expansion coefficients of the two metallic layers are different. However, the electrothermic type actuator has a slow thermal response because flexibility of the metallic layer is relatively poor.

What is needed, therefore, is to provide an electrostrictive composite having a fast thermal response, and an electrostrictive element using the same.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
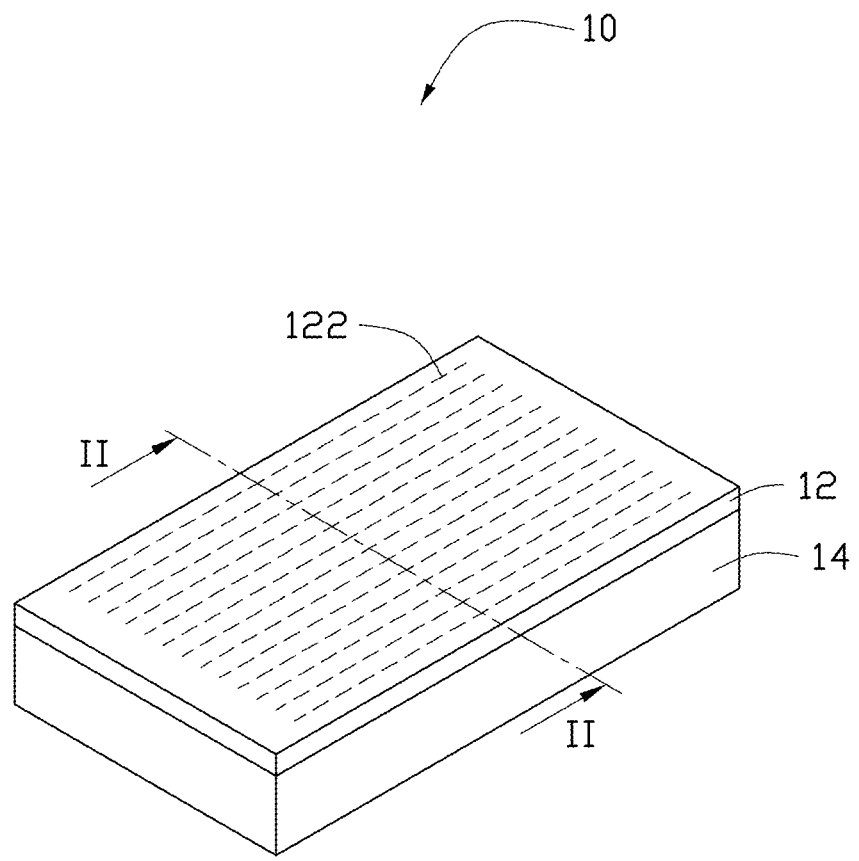
FIG. 1 is a schematic view of one embodiment of an electrostrictive composite.
Figure 2:
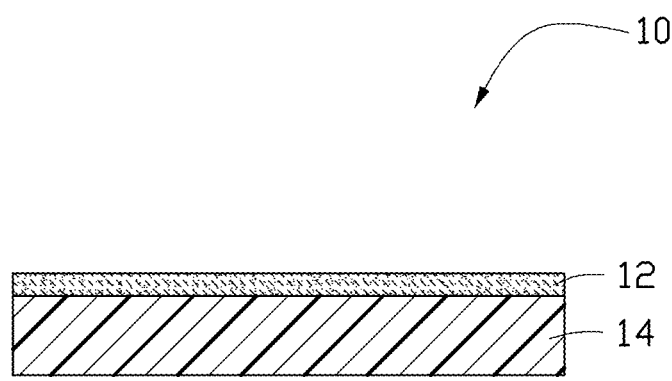
FIG. 2 is a schematic, cross-sectional view, taken along a line II-II of FIG. 1.

Referring to FIG. 1 and FIG. 2, one embodiment of an electrostrictive composite 10 includes a flexible polymer matrix 14 and a carbon nanotube film structure 12. The electrostrictive composite 10 and the carbon nanotube film structure 12 are sheets. The structure 12 includes a plurality of carbon nanotubes 122 combined by van der Waals attractive force therebetween. The carbon nanotube film structure 12 is disposed on a first surface of the flexible polymer matrix 14. The carbon nanotube film structure 12 is at least partially embedded into the flexible polymer matrix 14 through the first surface of the flexible polymer matrix 14. The carbon nanotube film structure 12 has a thermal expansion coefficient less than that of the flexible polymer matrix 14. A thickness of the electrostrictive composite 10 can range from about 20 micrometers to about 5 millimeters. The thermal expansion coefficients of the flexible polymer matrix 14 and carbon nanotube film structure 12 are different.

Figure 3:
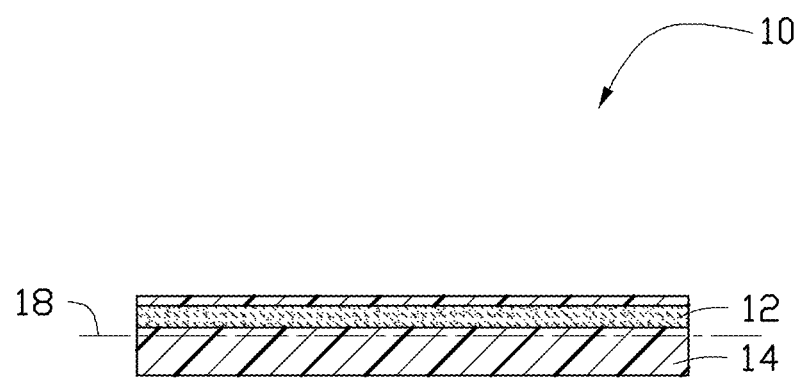
FIG. 3 is a schematic, cross-sectional view of another embodiment of an electrostrictive composite.

Referring to FIG. 3, in one embodiment, the electrostrictive composite 10 is a rectangular plate with the carbon nanotube film structure 12 entirely embedded in the flexible polymer matrix 14. The polymer matrix 14 has a dividing plane 18 which is a central plane parallel to the surface of the polymer matrix 14. The dividing plane 18 divides the polymer matrix 14 into two approximately symmetrical parts. The carbon nanotube film structure 12 is not disposed on the dividing plane 18 of the flexible polymer matrix 14. The carbon nanotube film structure 12 is offset from a central plane of the flexible polymer matrix 14. Thus, the thermal expansion coefficients on opposite sides of the dividing plane 18 of the electrostrictive composite 10 are different.

A thickness of the flexible polymer matrix 14 can range from about 20 micrometers to about 4 millimeters. A material of the flexible polymer matrix 14 can be silicone elastomer, poly methyl methacrylate, polyurethane, epoxy resin, polypropylene acid ethyl ester, acrylic acid ester, polystyrene, polybutadiene, polyacrylonitrile, polyaniline, polypyrrole, polythiophene or combinations thereof. In one embodiment, the flexible polymer matrix 14 is a rectangular plate made of silicone elastomer with a thickness of about 0.7 millimeters, a length of about 60 millimeters, and a width of about 30 millimeters.

The carbon nanotube film structure 12 can be a free-standing structure, that is, the carbon nanotube film structure 12 can be supported by itself and does not need a substrate for support. If a point of the carbon nanotube film structure 12 is held, the entire carbon nanotube film structure 12 can be supported from that point without being damaged. The carbon nanotube film structure 12 includes a plurality of carbon nanotubes 122 combined by van der Waals attractive force therebetween. The carbon nanotube film structure 12 can be a substantially pure structure consisting of the carbon nanotubes 122 with few impurities. In one embodiment, the entire carbon nanotube film structure 12 is attached on the top surface of the flexible polymer matrix 14. Alternatively, the carbon nanotube film structure 12 includes a plurality of micropores and the flexible polymer matrix 14 is permeated in the micropores of the carbon nanotube film structure 12.

Figure 4:
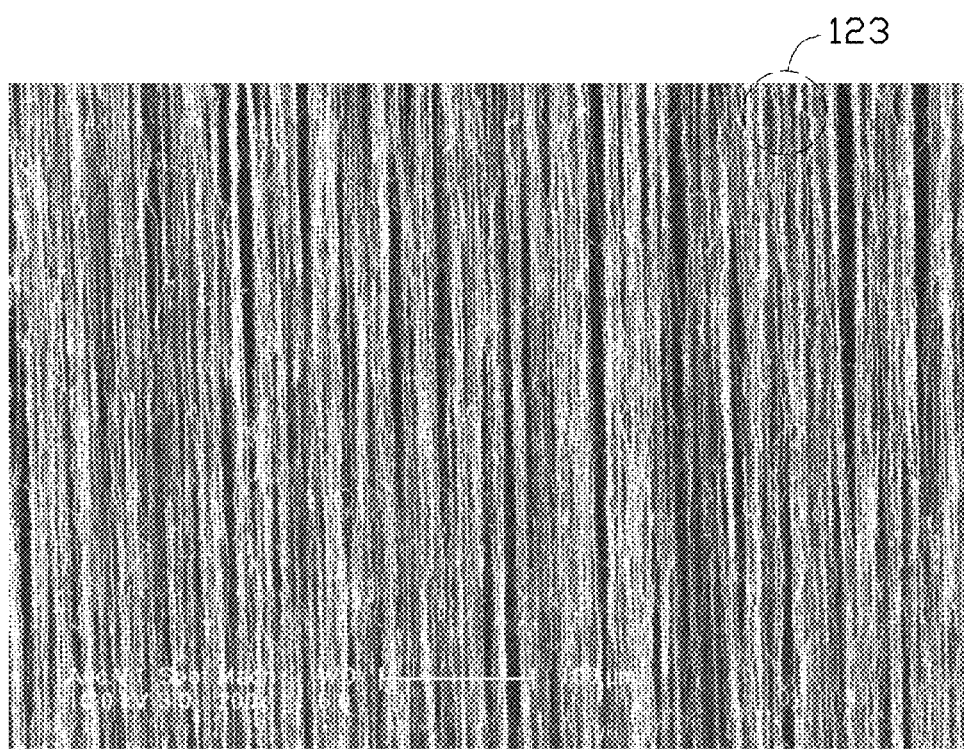
FIG. 4 is a Scanning Electron Microscope (SEM) image of a drawn carbon nanotube film which can be used in the electrostrictive composite of FIG. 1.
Figure 5:
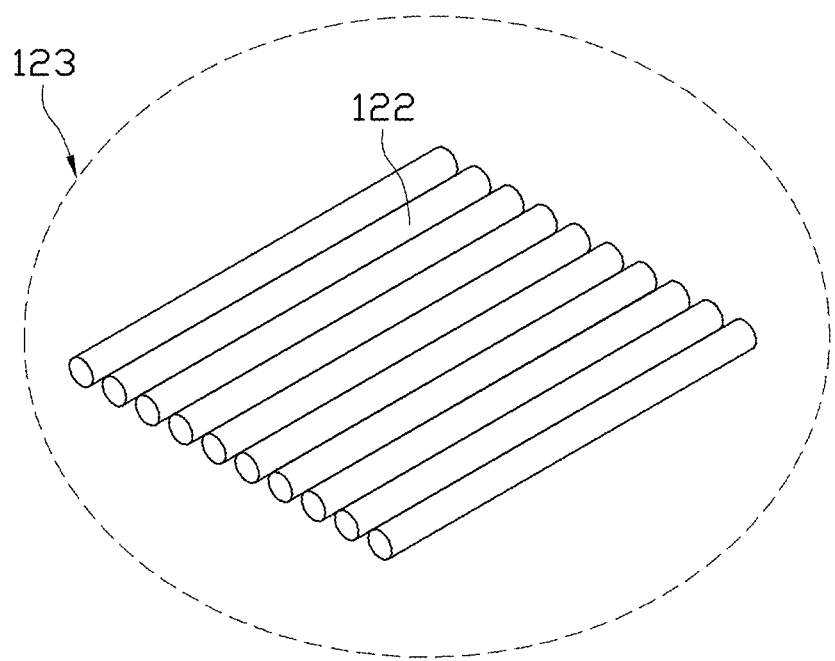
FIG. 5 is a schematic view of a carbon nanotube segment in the drawn carbon nanotube film of FIG. 4.

In one embodiment, the carbon nanotube film structure 12 includes at least one drawn carbon nanotube film. A film can be drawn from a carbon nanotube array, to obtain a drawn carbon nanotube film. Examples of drawn carbon nanotube films are taught by U.S. Pat. No. 7,045,108 to Jiang et al., and WO 2007015710 to Zhang et al. The drawn carbon nanotube film includes a plurality of successive and oriented carbon nanotubes joined end-to-end by van der Waals attractive force therebetween. The drawn carbon nanotube film is a free-standing film. Referring to FIGS. 4 and 5, each drawn carbon nanotube film includes a plurality of successively oriented carbon nanotube segments 123 joined end-to-end by van der Waals attractive force therebetween. Each carbon nanotube segment 123 includes a plurality of carbon nanotubes 122 substantially parallel to each other, and combined by van der Waals attractive force therebetween. As can be seen in FIG. 2, some variations can occur in the drawn carbon nanotube film. The carbon nanotubes 122 in the drawn carbon nanotube film are substantially oriented along a preferred orientation. The carbon nanotube film can be treated with an organic solvent to increase the mechanical strength and toughness of the carbon nanotube film and reduce the coefficient of friction of the carbon nanotube film. The thickness of the carbon nanotube film can range from about 0.5 nm to about 100 µm.

In other embodiments, the carbon nanotube film structure 12 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientations of carbon nanotubes in adjacent films, whether stacked or arrayed side by side. Adjacent carbon nanotube films can be combined by just the van der Waals attractive force therebetween. The number of layers of the carbon nanotube films is not limited. An angle between the aligned directions of the carbon nanotubes in two adjacent carbon nanotube films can range from about 0 degrees to about 90 degrees. The carbon nanotube film structure 12 in an embodiment employing these films will have a plurality of micropores. Stacking the carbon nanotube films will also add to the structural integrity of the carbon nanotube film structure 12.

Figure 6:
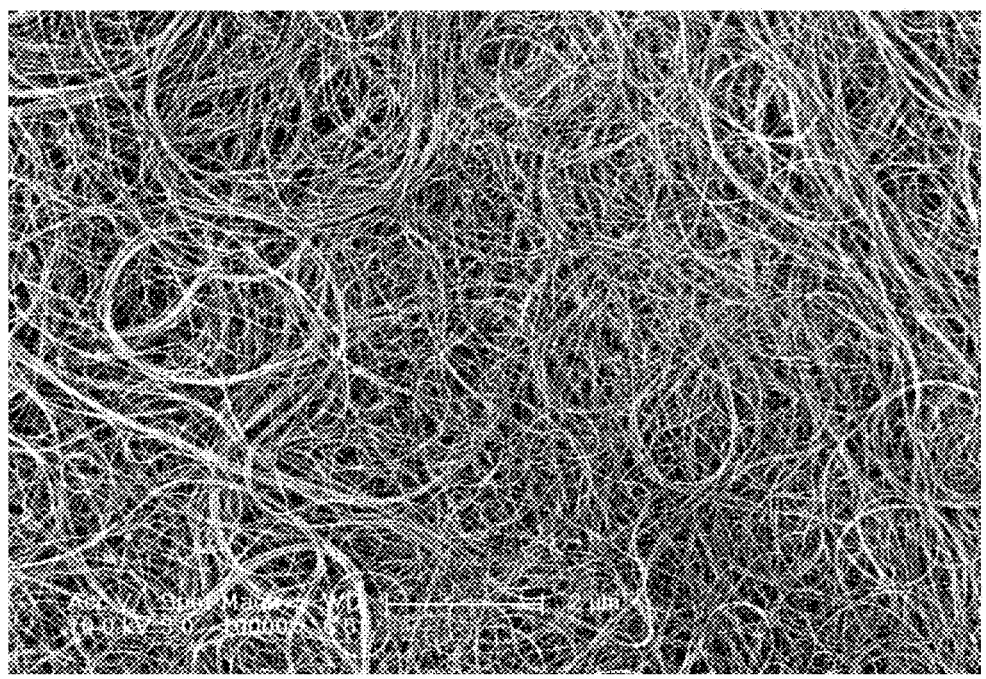
FIG. 6 is an SEM image of a flocculated carbon nanotube film.

In other embodiments, the carbon nanotube film structure 12 includes a flocculated carbon nanotube film. Referring to FIG. 6, the flocculated carbon nanotube film can include a plurality of long, curved, disordered carbon nanotubes entangled with each other. Further, the flocculated carbon nanotube film can be isotropic. The carbon nanotubes can be substantially uniformly dispersed in the carbon nanotube film. Adjacent carbon nanotubes are acted upon by van der Waals attractive force to obtain an entangled structure with micropores defined therein. It is understood that the flocculated carbon nanotube film is very porous. Sizes of the micropores can be less than 10 µm. The porous nature of the flocculated carbon nanotube film will increase the specific surface area of the carbon nanotube film structure. Further, because the carbon nanotubes in the carbon film nanotube structure 12 are entangled with each other, the carbon nanotube film structure 12 employing the flocculated carbon nanotube film has excellent durability, and can be fashioned into desired shapes with a low risk to the integrity of the carbon nanotube film structure 12. The thickness of the flocculated carbon nanotube film can range from about 0.5 nm to about 1 mm.

Figure 7:
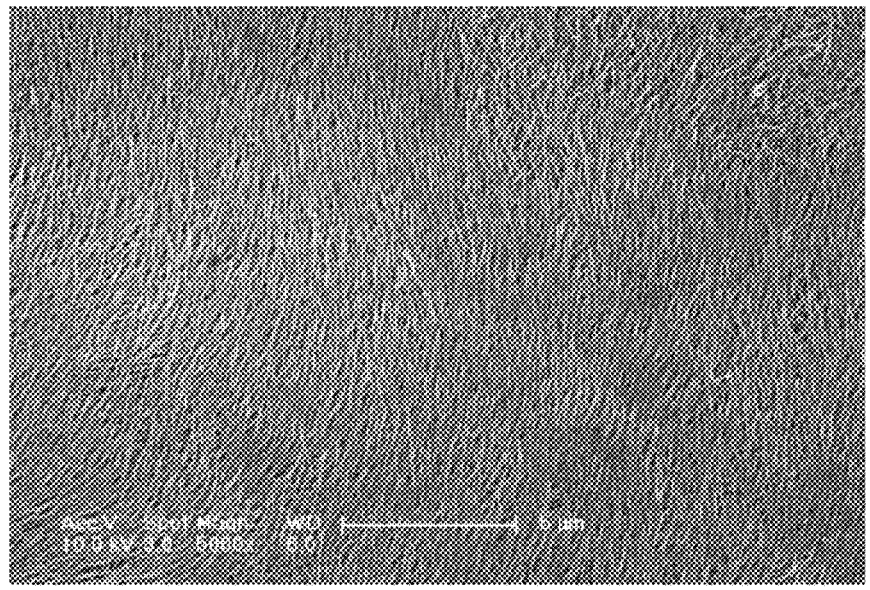
FIG. 7 is an SEM image of a pressed carbon nanotube film.

In other embodiments, the carbon nanotube film structure 12 can include a pressed carbon nanotube film. Referring to FIG. 7, the pressed carbon nanotube film can be a free-standing carbon nanotube film. The carbon nanotubes in the pressed carbon nanotube film are arranged along a same direction or along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degrees to approximately 15 degrees. The greater the pressure applied, the smaller the angle obtained. When the carbon nanotubes in the pressed carbon nanotube film are arranged along different directions, the carbon nanotube film structure 12 can be isotropic. Here, "isotropic" means the carbon nanotube film has properties substantially identical in all directions substantially parallel to a surface of the carbon nanotube film. The thickness of the pressed carbon nanotube film ranges from about 0.5 nm to about 1 mm. An example of pressed carbon nanotube film is taught by US PGPub. 20080299031A1 to Liu et al.

In one embodiment of FIG. 1, the carbon nanotube film structure 12 includes a plurality of drawn carbon nanotube films stacked together, the carbon nanotubes of each drawn carbon nanotube film are substantially aligned along one preferred orientation.

Figure 8:
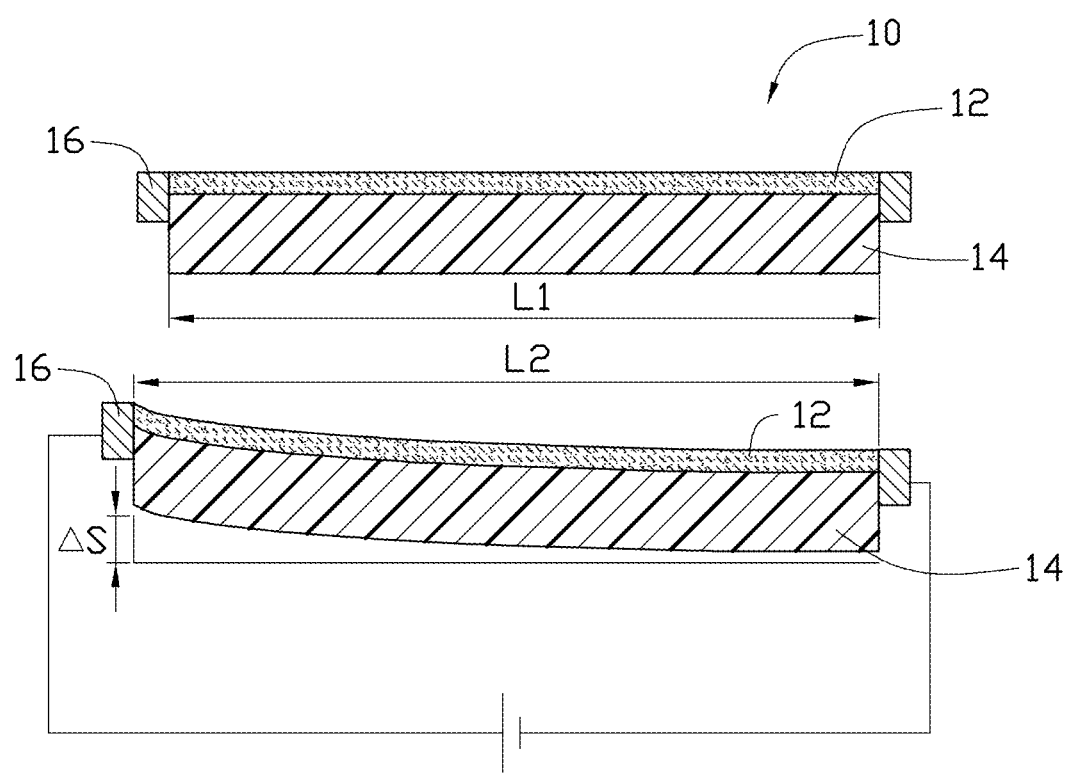
FIG. 8 is a schematic view of the electrostrictive composite of FIG. 1 before and after expansion.

Referring to FIG. 8, the operating principle of the electrothermic composite 10 is described as follows. When a voltage is applied to the carbon nanotube film structure 12 via two electrodes 16, a current flows through the carbon nanotube film structure 12. The carbon nanotubes 122 convert the electric energy to heat thereby heating the flexible polymer matrix 14, which allows the flexible polymer matrix 14 to expand along from one electrode 16 to the other. The thermal expansion coefficients of the flexible polymer matrix 14 and the carbon nanotube film structure 12 are different so that the electrothermic composite 10 bends in a direction oriented to the carbon nanotube film structure 12 with a smaller thermal expansion coefficient.

The expansion coefficient of the electrostrictive composite 10 with an original length L1 of about 34 millimeters, an original thickness of about 0.7 millimeters, and an original width of about 5 millimeters is tested. The carbon nanotube film structure 12 has a thickness of about 20 micrometers. After a voltage of 40 V is applied to the electrostrictive composite 10 for about 2 minutes, a displacement ΔS, as shown in FIG. 8, is about 16 millimeters.

Figure 9:
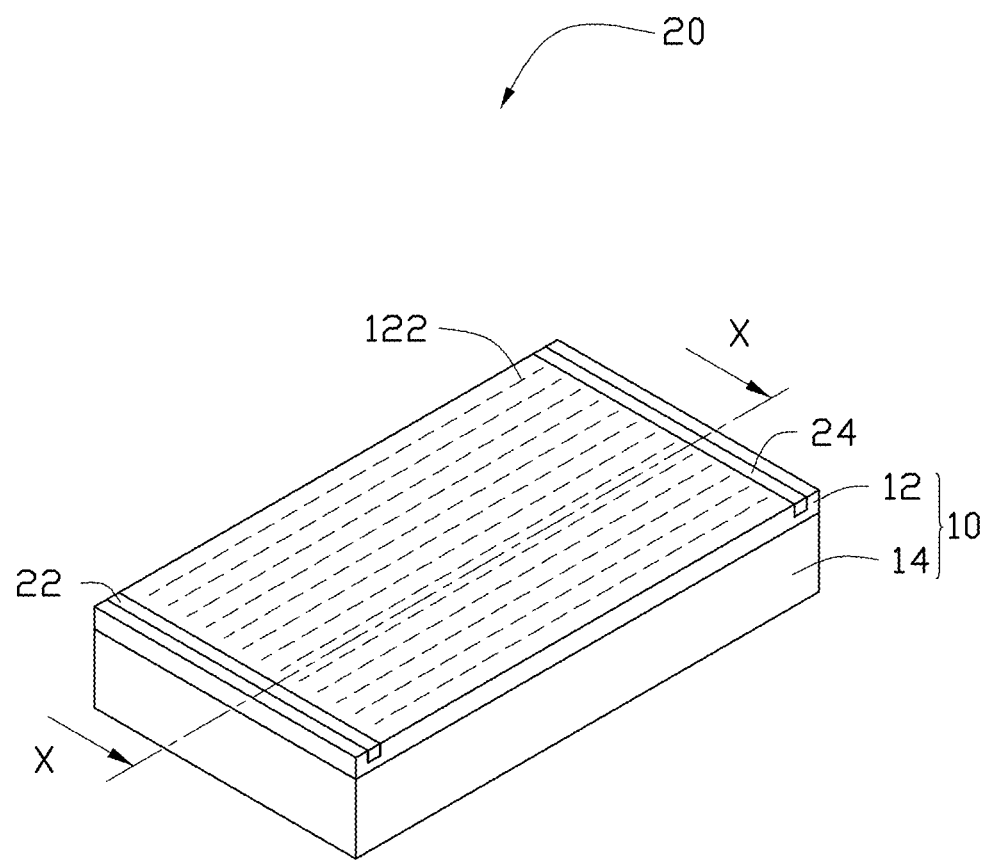
FIG. 9 is a schematic structural view of one embodiment of an electrostrictive element.
Figure 10:
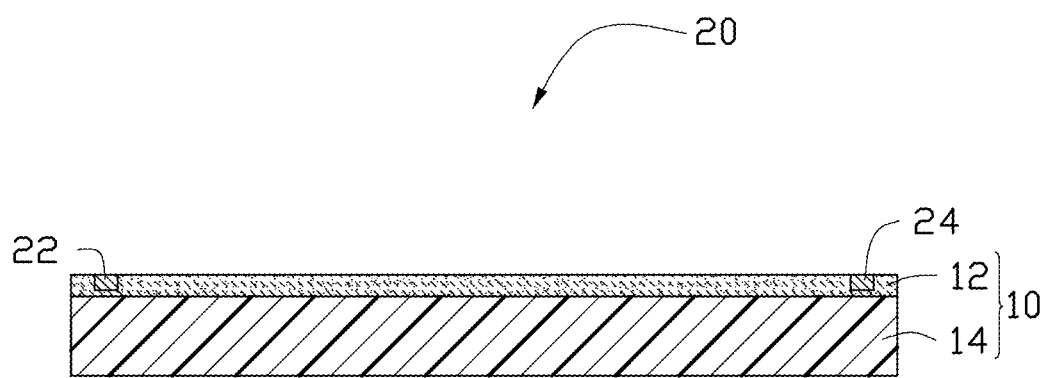
FIG. 10 is a schematic, cross-sectional view, taken along line X-X of FIG. 9.

Referring to FIG. 9 and FIG. 10, an electrothermic element 20 according to one embodiment is shown. The electrothermic element 20 includes an electrostrictive composite 10, a first electrode 22, and a second electrode 24. The first electrode 22 and the second electrode 24 are separately disposed on and electrically connected to the carbon nanotube film structure 12.

In one embodiment, the first electrode 22 and the second electrode 24 are separately located on and electrically connected to two ends of the carbon nanotube film structure 12. The first electrode 22 and the second electrode 24 can be made of metal, alloy, conductive resin, indium-tin oxide (ITO), conductive adhesive, carbon nanotube, carbon grease, and any other suitable materials. The shapes of the first electrode 22 and the second electrode 24 are arbitrary. In one embodiment, the first electrode 22 and the second electrode 24 are two copper sheets. In other embodiments, the first electrode 22 and the second electrode 24 are two copper wires.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An electrostrictive composite comprising:
a flexible polymer matrix having a first surface; and
a carbon nanotube film structure comprising a plurality of carbon nanotubes combined by van der Waals attractive force therebetween;
wherein the carbon nanotube film structure is at least partially embedded in the flexible polymer matrix through the first surface, the plurality of carbon nanotubes is parallel to the first surface, and a thickness of a carbon nanotube film structure embedded in the flexible polymer matrix is less than a thickness of the flexible polymer matrix.

2. The electrostrictive composite as claimed in claim 1, wherein the carbon nanotube film structure comprises at least one carbon nanotube film.

3. The electrostrictive composite as claimed in claim 2, wherein the at least one carbon nanotube film is a drawn carbon nanotube film comprising a plurality of carbon nanotubes substantially parallel to each other.

4. The electrostrictive composite as claimed in claim 3, wherein the at least one carbon nanotube film comprises a plurality of carbon nanotube films stacked together, the plurality of carbon nanotubes of each of the plurality of carbon nanotube films being substantially aligned along a preferred orientation.

5. The electrostrictive composite as claimed in claim 2, wherein the at least one carbon nanotube film is a flocculated carbon nanotube film comprising a plurality of long, curved, disordered carbon nanotubes entangled with each other.

6. The electrostrictive composite as claimed in claim 2, wherein the at least one carbon nanotube film is a pressed carbon nanotube film comprising a plurality of carbon nanotubes substantially arranged along a same direction or along different directions entangled with each other.

7. The electrostrictive composite as claimed in claim 1, wherein the carbon nanotube film structure comprises a plurality of micropores, and at least part of the flexible polymer matrix is located in the plurality of micropores of the carbon nanotube film structure.

8. The electrostrictive composite as claimed in claim 1, wherein the carbon nanotube film structure has a thermal expansion coefficient less than the thermal expansion coefficient of the flexible polymer matrix.

9. The electrostrictive composite as claimed in claim 1, wherein a material of the flexible polymer matrix is selected from the group consisting of silicone elastomer, poly methyl methacrylate, polyurethane, epoxy resin, polypropylene acid ethyl ester, acrylic acid ester, polystyrene, polybutadiene, polyacrylonitrile, polyaniline, polypyrrole, and polythiophene.

10. The electrostrictive composite as claimed in claim 1, wherein the carbon nanotube film structure is partially embedded in the flexible polymer matrix and partially located on the first surface of the flexible polymer matrix.

11. The electrostrictive composite as claimed in claim 1, wherein the carbon nanotube film structure is entirely embedded into the flexible polymer matrix.

12. The electrostrictive composite as claimed in claim 11, wherein the carbon nanotube film structure is located at an offset from a central dividing plane of the flexible polymer matrix.

13. The electrostrictive composite as claimed in claim 12, wherein the central dividing plane runs parallel to the first surface of the flexible polymer matrix.

14. The electrostrictive composite as claimed in claim 12, wherein the central dividing plane divides the flexible polymer matrix into two approximately symmetrical parts.

15. The electrostrictive composite as claimed in claim 12, wherein the thermal expansion coefficients on two opposite sides of the central dividing plane of the flexible polymer matrix are different.

16. The electrostrictive composite as claimed in claim 12, wherein a thickness of the flexible polymer matrix ranges from about 20 micrometers to about 4 millimeters.

* * * * *